US006265937B1

(12) United States Patent
Mohwinkel et al.

(10) Patent No.: US 6,265,937 B1
(45) Date of Patent: Jul. 24, 2001

(54) PUSH-PULL AMPLIFIER WITH DUAL COPLANAR TRANSMISSION LINE

(75) Inventors: Clifford A. Mohwinkel; Mark J. Vaughan, both of San Jose, CA (US)

(73) Assignee: Endgate Corporation, Sunnyvale, CA (US)

( * ) Notice: Subject to any disclaimer, the term of this patent is extended or adjusted under 35 U.S.C. 154(b) by 0 days.

(21) Appl. No.: 09/323,438

(22) Filed: Jun. 1, 1999

Related U.S. Application Data (60) Continuation-in-part of application No. 08/697,927, filed on Sep. 3, 1996, which is a division of application No. 08/400,025, filed on Mar. 6, 1995, now Pat. No. 5,698,469, which is a continuation-in-part of application No. 08/313,927, filed on Sep. 26, 1994, now abandoned, application No. 08/725,972, filed on Oct. 4, 1996, which is a continuation-in-part of application No. 08/400,025, filed on Mar. 6, 1995, now Pat. No. 5,698,469, which is a continuation-in-part of application No. 08/313,927, filed on Sep. 26, 1994, now abandoned.

(51) Int. Cl.[7] .................................. H03F 3/26; H01P 1/00
(52) U.S. Cl. .............................. 330/55; 330/286; 333/247
(58) Field of Search ............................ 330/55, 286, 307; 333/247

(56) References Cited

U.S. PATENT DOCUMENTS

| 3,517,278 | 6/1970 | Hager . |
| 3,622,385 | 11/1971 | Stork . |

(List continued on next page.)

FOREIGN PATENT DOCUMENTS

| 41 28334 A1 | 3/1993 | (DE) . |
| 0 358 497 A2 A3 | 3/1990 | (EP) . |
| 0 627 765 A1 | 12/1994 | (EP) . |
| 57-154859 | 9/1982 | (JP) . |
| 60-106027 | 6/1985 | (JP) . |
| 60-153603 | 8/1985 | (JP) . |
| 60-163602 | 8/1985 | (JP) . |
| 61-189578 | 2/1988 | (JP) . |
| 63-187710 | 8/1988 | (JP) . |
| 63-240102 | 10/1988 | (JP) . |
| 1-005102 | 1/1989 | (JP) . |
| 1-269305 | 10/1989 | (JP) . |
| 3-55877 | 3/1991 | (JP) . |

OTHER PUBLICATIONS

M. Goetz et al., "Measurement of a 24–Ghz Broad–Band Multilayer Ceramic Feedthru for Microwave Packaging", *IEEE Microwave and Guided Wave Letters*, May 1992, No. 5, pp. 171–173.

(List continued on next page.)

*Primary Examiner*—Robert Pascal
*Assistant Examiner*—Khanh Van Nguyen
(74) *Attorney, Agent, or Firm*—Edward B. Anderson (57) ABSTRACT

A means of connecting a plurality of essentially identical active devices is presented for the purpose of multifunction and multiple function operation. These devices, mounted on a chip, are flip-mounted onto a circuit formed on a base substrate and having large passive elements. Push-pull amplifiers are presented as examples in which the multiple function operation is the combining of amplifiers whose active devices are on a single chip. Electromagnetic coupling, impedance matching and signal transmission are variously provided by the use of strip lines, slotlines, coplanar waveguides, and a slotline converted into a coplanar waveguide.

11 Claims, 7 Drawing Sheets-

U.S. PATENT DOCUMENTS

| | | |
|---|---|---|
| 3,878,550 | 4/1975 | Benjamin . |
| 3,939,430 | 2/1976 | Dickins et al. . |
| 3,995,239 | 11/1976 | Head et al. . |
| 4,005,375 | 1/1977 | Pringle et al. . |
| 4,032,849 | 6/1977 | Gysel et al. . |
| 4,097,814 | 6/1978 | Cohn . |
| 4,135,168 | 1/1979 | Wade . |
| 4,182,636 | 1/1980 | Dennard et al. . |
| 4,193,048 | 3/1980 | Nyhus . |
| 4,249,263 | 2/1981 | Shinkawa et al. . |
| 4,290,078 | 9/1981 | Ronen . |
| 4,320,536 | 3/1982 | Dietrich . |
| 4,376,287 | 3/1983 | Sechi . |
| 4,377,005 | 3/1983 | Marchand et al. . |
| 4,411,022 | 10/1983 | Clifton et al. . |
| 4,430,623 | 2/1984 | Bert et al. . |
| 4,485,488 | 11/1984 | Houdart . |
| 4,523,163 | 6/1985 | Houdart et al. . |
| 4,542,535 | 9/1985 | Bates et al. . |
| 4,553,265 | 11/1985 | Clifton et al. . |
| 4,553,266 | 11/1985 | Bates et al. . |
| 4,603,436 | 7/1986 | Butler . |
| 4,607,394 | 8/1986 | Nightingale . |
| 4,612,408 | 9/1986 | Moddel et al. . |
| 4,617,586 | 10/1986 | Cuvilliers et al. . |
| 4,658,440 | 4/1987 | Pavio et al. . |
| 4,688,000 | 8/1987 | Donovan et al. . |
| 4,739,519 | 4/1988 | Findley . |
| 4,751,744 | 6/1988 | Pavio, Jr. . |
| 4,949,398 | 8/1990 | Maas . |
| 4,955,079 | 9/1990 | Connerney et al. . |
| 4,973,918 * | 11/1990 | Schindler ............................ 330/286 |
| 5,066,925 * | 11/1991 | Freitag .............................. 330/286 |
| 5,066,926 | 11/1991 | Ramachandran et al. . |
| 5,087,896 | 2/1992 | Wen et al. . |
| 5,105,171 | 4/1992 | Wen et al. . |
| 5,115,245 | 5/1992 | Wen et al. . |
| 5,127,102 | 6/1992 | Russell . |
| 5,138,436 | 8/1992 | Koepf . |
| 5,142,239 | 8/1992 | Brayton et al. . |
| 5,149,671 | 9/1992 | Koh et al. . |
| 5,194,833 | 3/1993 | Dougherty et al. . |
| 5,206,986 | 5/1993 | Arai et al. . |
| 5,221,910 * | 6/1993 | Tournier ............................ 330/307 |
| 5,265,266 | 11/1993 | Trinh . |
| 5,266,963 | 11/1993 | Carter . |
| 5,303,419 | 4/1994 | Ittipiboon et al. . |
| 5,345,194 | 9/1994 | Nagasako . |
| 5,352,998 | 10/1994 | Tanino . |
| 5,355,095 * | 10/1994 | Nathanson et al. .................. 330/307 |
| 5,366,906 | 11/1994 | Wojnarowski et al. . |
| 5,394,490 | 2/1995 | Kato et al. . |
| 5,426,400 | 6/1995 | Ho et al. . |
| 5,491,449 | 2/1996 | Johnson et al. . |
| 5,498,886 | 3/1996 | Hsu et al. . |
| 5,519,358 * | 5/1996 | Tserng ................................ 330/307 |
| 5,528,203 | 6/1996 | Mohwinkel . |
| 5,535,445 | 7/1996 | Gunton . |
| 5,610,563 | 3/1997 | Mohwinkel . |

OTHER PUBLICATIONS

H.B. Sequeira et al., "Monolithic GaAs W–Band Pseudomorphic Modfet Amplifiers", $12^{th}$ Annual GaAs Symposium Technical Digest 1990, Oct. 7–10, 1990, pp. 161–164.

John J. Burke et al., "Surface–to'Surface Transition via Electromagnetic Coupling of Microstrip and Coplanar Waveguide", *IEEE Tranactions on Microwave Theory and Techniques*, vol. 37, No. 3, Mar. 1989, pp. 519–525.

Wohlert & Immorlica, "Flip–Chip BeO Technology Applied to GaAs Active Aperture Radars", Microwave Journal, 11/82, pp. 109–113.

Young, consultant, Illingworth, Editor, "Emitter–Coupled Logic", The Penguin Dictionary of Electronics, Second Edition, 1988, pp. 162–165.

Horowitz, "Fet Switches", MOSFET Logic and Power Switches, The Art of Electronics, Second Edition, 1989, p. 159.

Balents, Leon M., "Hermetically Sealed Semiconductor "Flip–Chip" Assembly", Feb. 11, 1970, 2 pages.

Ulrich L. Rohde, "Performance Capability of Active Mixers", Professional Program Session Record 24, Wescon/81, pp. 1–17, Electronic Show & Convention, Sep. 15–17, 1981—Brooks Hall & Civic Auditorium, Program—Hilton Hotel, San Francisco, California.

S. Weiner, D. Neuf, S. Spohrer, "2 to 8 GHZ Double Balanced Mesfet Mixer with +30 DBM Input $3^{rd}$ Order Intercept", 1988 IEEE MTT–S Digest, pp. 1097–1100.

Masayoshi Aikawa et al., "MMIC Progress in Japan", IEEE 1989 Microwave and Millimeter–Wave Monolithic Circuits Symposium Digest of Papers, Jun. 12–13, 1989, pp. 1–6, IEEE, U.S.A.

P. Wallace, A. Wohlert & A.A. Immorlica, Jr., D. Buck, "Flip–Chip BeO Technology Applied to GaAs Active Aperture Radars", *Microwave Journal*, Nov. 1982, pp. 109–113.

N. Takachio, K. Iwashita, S. Hata, K. Katsura, K. Onodera, H. Kikuchi, "A 10 Gb/S Optical Heterodyne Detection Experiment Using a 23 Ghz Bandwidth Balanced Receiver", *1990 IEEE MTT–S Digest*, pp. 149–151.

J. L.B. Walker, ed., *High–Power GaAs FET Amplifiers*, 1993 Artech House, Inc., ISBN 0 89006 479 2, pp. 87–90.

* cited by examiner

PUSH-PULL AMPLIFIER WITH DUAL COPLANAR TRANSMISSION LINE

CROSS-REFERENCE TO RELATED APPLICATIONS

This application is a continuation-in-part of U.S. application Ser. No. 08/697,927 filed on Sep. 3, 1996, which is a division of U.S. application Ser. No. 08/400,025 filed Mar. 6, 1995, now U.S. Pat. No. 5,698,469, which is a continuation-in-part of U.S. application Ser. No. 08/313,927 filed on Sep. 26, 1994, now abandoned. This application is also a continuation in part of U.S. application Ser. No. 08/725,972 filed Oct. 4, 1996, which is a continuation-in-part of U.S. application Ser. No. 08/400,025 filed Mar. 6,1995, now U.S. Pat. No. 5,698,469, which is a continuation-in-part of U.S. application Ser. No. 08/313,927 filed on Sep. 26, 1994, now abandoned. This application claims the benefit of each of these prior applications.

STATEMENT REGARDING FEDERALLY SPONSORED RESEARCH OR DEVELOPMENT

Not applicable.

BACKGROUND OF THE INVENTION

1. Field of the Invention

This invention relates to push-pull amplifiers, and in particular to push-pull amplifiers having active devices connected to coplanar transmission lines having coplanar conductors formed on a base substrate.

2. Related Art

Because GaAs integrated circuits are comparatively expensive, it is common to make microwave and millimeter (mm) wave circuits as hybrid circuits. The active devices that require the use of GaAs are fabricated on GaAs chips which are then mounted on a motherboard or base substrate made of a less expensive material, such as silicon, $Al_2O_3$, BeO, and AIN.

Conventional circuits having a plurality of active devices are made by fabricating a separate integrated circuit or chip for each of the active devices. Circuit metalization and passive devices are printed on the base substrate and each chip is then mounted at an assigned site on the base substrate. The integrated circuit on the chip can be very simple, such as a single FET. It may also be more complex, incorporating a variety of devices to provide an overall function, such as is provided by an amplifier.

A complex circuit may require that numerous such chips be made and mounted. The resultant requirement for individual handling of small chips also tends to make the fabrication process somewhat costly. Alternatively, when a chip has a complex circuit, it is more expensive to make since it requires a larger GaAs substrate than its more simple cousin, and the benefits of hybrid circuit structure are not as fully realized.

There is thus a need for a method of hybrid circuit construction, and thereby a hybrid circuit structure that, when applied to microwave and mm-wave circuits, has reduced size and is simple to fabricate, thereby providing for efficient fabrication at reduced cost.

SUMMARY OF THE INVENTION

These benefits are achieved in the present invention which is directed to a push-pull amplifier having a plurality of pairs of active devices connected to a corresponding plurality of coplanar transmission lines formed on a base substrate. More particularly, the present invention is directed to a push-pull amplifier having first and second coplanar transmission lines on a substrate surface and having respective first and second pairs of conductors. The first conductor of each pair conducts a signal in phase opposition relative to a signal conducted on the second conductor of the pair. An active device associated with each conductor has an input or output terminal connected to the associated conductor, whereby each pair of active devices is connected in push-pull configuration.

A first embodiment of a push-pull amplifier made according to the invention comprises a first pair of active devices, such as field-effect transistors (FETs), having respective control terminals (gates) and current-carrying terminals (drains and sources). One of the current-carrying terminals of each of the active devices is coupled to a reference potential, such as a circuit or virtual ground. An input electromagnetic coupler, such as a transformer or balun, has an input primary conductor electrically coupled between the input terminal and the control terminal of a first one of the pair of active devices. An input secondary conductor is electromagnetically coupled to the input primary conductor and electrically coupled between an input reference potential and the control terminal of a second one of the pair of active devices.

An output electromagnetic coupler has a primary conductor electrically coupled between the other of the current-carrying terminals of the first active device and the output terminal. An output secondary conductor is electromagnetically coupled to the output primary conductor and is electrically coupled between the other of the current-carrying terminals of the second active device and the reference potential of the output primary conductor.

As a result, the signal on the output terminal is a combination of the signals being conducted by the pair of active devices. The pair of active devices may be formed on a single chip having separate terminals connected to the active devices which are flip-mounted onto corresponding terminals on a substrate on which the transformers or baluns are formed. The input and output transformers or baluns may also be formed as slotlines or coplanar waveguides on the substrate. Dual pairs of active devices are connected in series to form a higher power amplifier.

In a second embodiment of a push-pull amplifier made according to the invention, balanced signals in phase opposition are fed via each pair of conductors of a slotline to a corresponding pair of active devices. Pairs of such push-pull amplifiers are connected in parallel. Adjacent conductors of adjacent slotlines preferably conduct in-phase signals. When the signal applied is an unbalanced signal and the common or ground potential is applied to the outer conductors, the signal lines are shielded.

It will thus be apparent that the present invention provides a circuit which is simple and economical to construct, while providing improved operational benefits. These and other features and advantages of the present invention will be apparent from the preferred embodiments described in the following detailed description and illustrated in the accompanying drawings.

DETAILED DESCRIPTION OF THE PREFERRED EMBODIMENT

Figure 1:
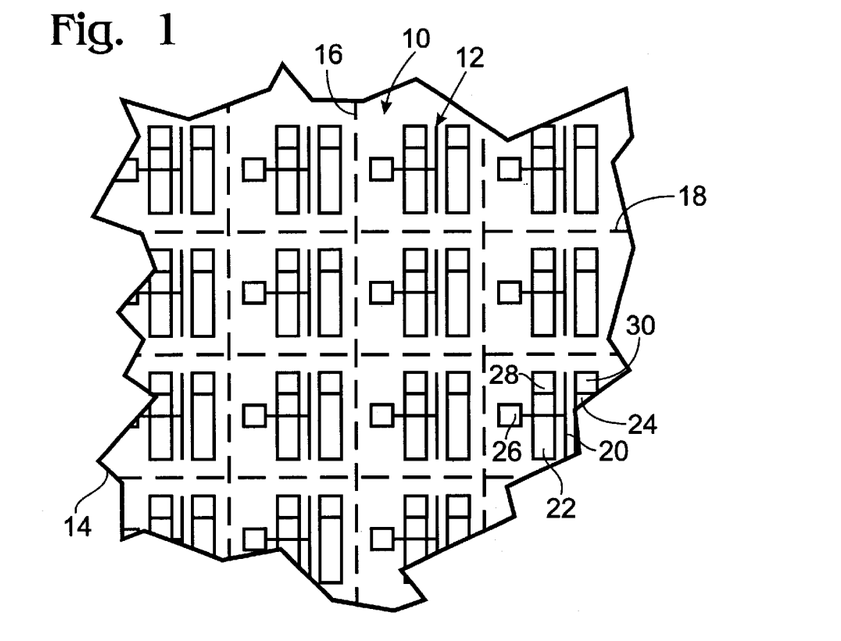
FIG. 1 is a simplified plan view of a portion of a wafer having an array of FETs for use in making a circuit according to the invention.

One aspect of the present invention is directed to the use of a single chip having a plurality of active devices separately connected to a subcircuit formed on a base substrate. Referring initially to FIG. 1, an array 10 of active devices, shown as FETs 12, are formed on a wafer 14 using conventional techniques. The term active device refers to individual elements, such as diodes or transistors, or to any related integrated circuit, such as an amplifier.

Vertical and horizontal dashed lines, such as lines 16 and 18, illustrate potential saw or scribe streets for dividing one or more sets of FETs from adjacent FETs. Each FET includes a gate 20, or control terminal, a source 22 and a drain 24. The source and drain are also referred to as current-carrying terminals. Each gate, source and drain is connected to at least one connection terminal, such as respective terminals 26, 28 and 30.

Figure 9:
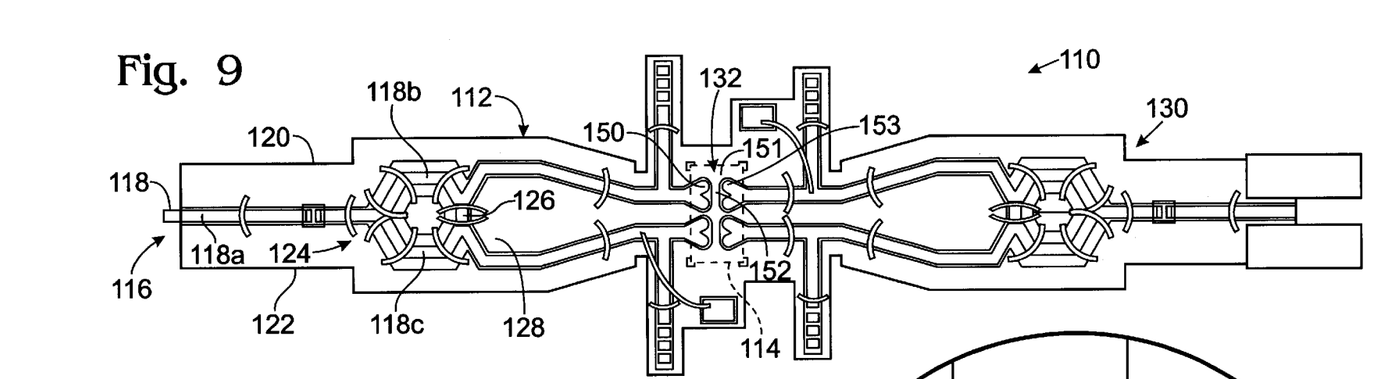
FIG. 9 illustrates a plan view of a circuit using coplanar waveguides.
Figure 10:
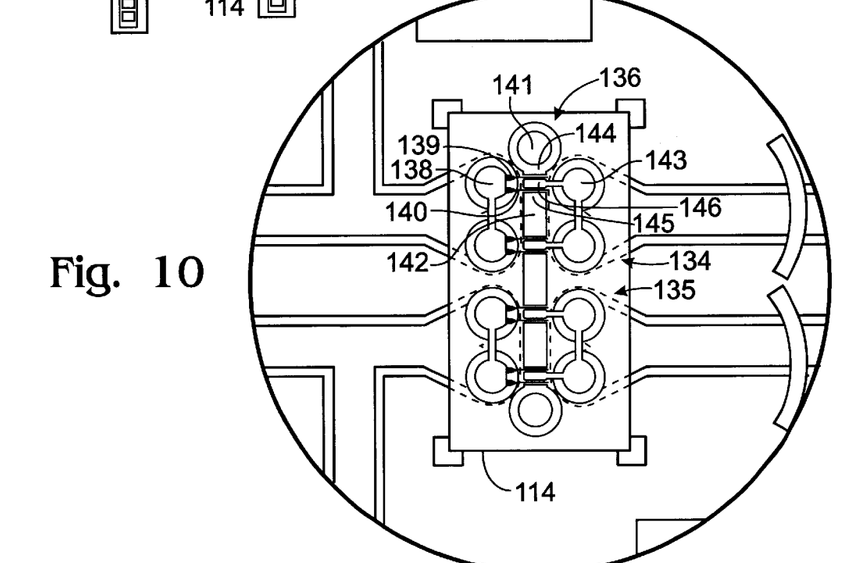
FIG. 10 is an enlarged view illustrating the FET layout for a chip in the circuit of FIG. 9.

Wafers 14 may be produced in large volumes, thereby making each active device relatively inexpensive. Selected wafers may then be divided into arrays of active devices by dividing them using a selected cut pattern so that the resulting chips have active devices with connection terminals corresponding in position to connection terminals on a base substrate. By changing the wafer cut pattern different arrays of active devices can be used to form different circuits. In one application of this concept, the active devices on a chip are not interconnected. In other applications, however, there may be some interconnection, while still having separate connection terminals for each active device. An example of this latter feature is shown in FIGS. 9 and 10, described below, in which adjacent like terminals, such as sources or drains, are connected together.

FIG. 1 illustrates a simple form of wafer in which all of the devices on the wafer are identical. When it is desired to use different devices, a wafer is made with clusters of the different devices in a repeated configuration or pattern.

One application where individual, multiple-device arrays may be used is in the construction of a gate array of large transistors for high current conduction or high power output. For microwave and mm-wave applications, this is often provided by the connection of FETs by Wilkinson combiners or the equivalent to provide impedance transformation as well as to combine multiple terminal connections.

Figure 2:
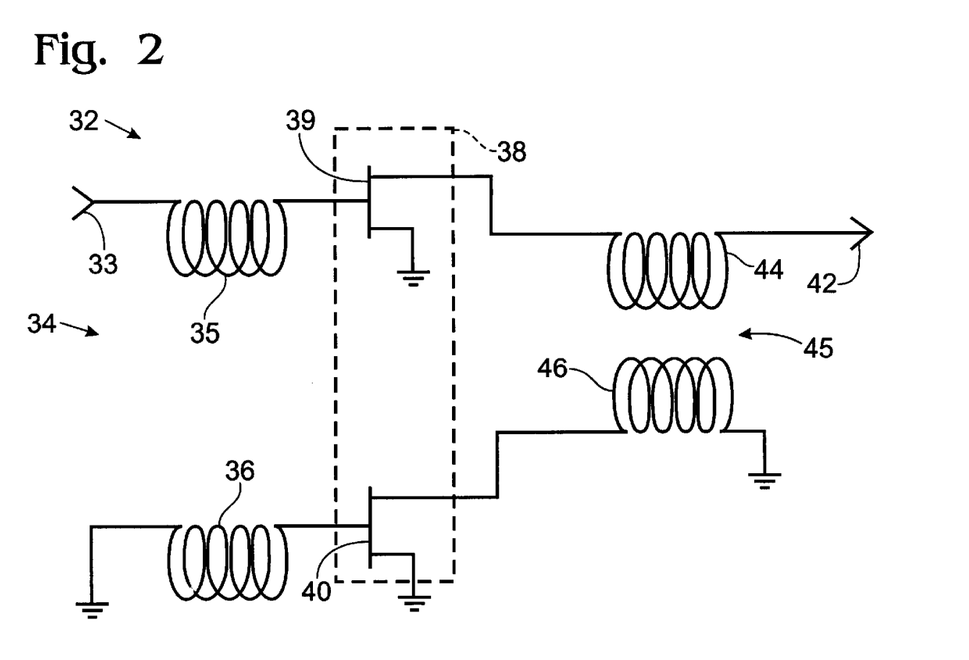
FIG. 2 is a schematic of a push-pull amplifier circuit that can be made according to the invention using a set of FETs from the array of FIG. 1.

Similar results may be achieved using a push-pull amplifier circuit, such as circuit 32 shown in FIG. 2. In this figure and the subsequent figures, dc biasing circuitry is not shown for purposes of clarity. This circuit, while providing inherent benefits, particularly with respect to impedance transformation, over conventional multi-FET, parallel connected power amplifiers, may be constructed using an active-device array chip as has been described with reference to FIG. 1. Circuit 32 includes an input terminal 33, an input electromagnetic coupling 34 formed by a first input coupling element 35 and a second input coupling element 36 electromagnetically coupled to element 35.

A chip 38, represented by dashed lines, includes first and second FETs 39 and 40. Element 35 couples the input terminal to the gate of the first FET. Element 36 couples the gate of the second FET to a common potential, such as ground.

The drain of FET 39 is coupled to an output terminal 42 by a first output coupling element 44 forming part of an output electromagnetic coupling 45. A second output coupling element 46, electromagnetically coupled with element 44, couples the drain of FET 40 to ground.

Figure 3:
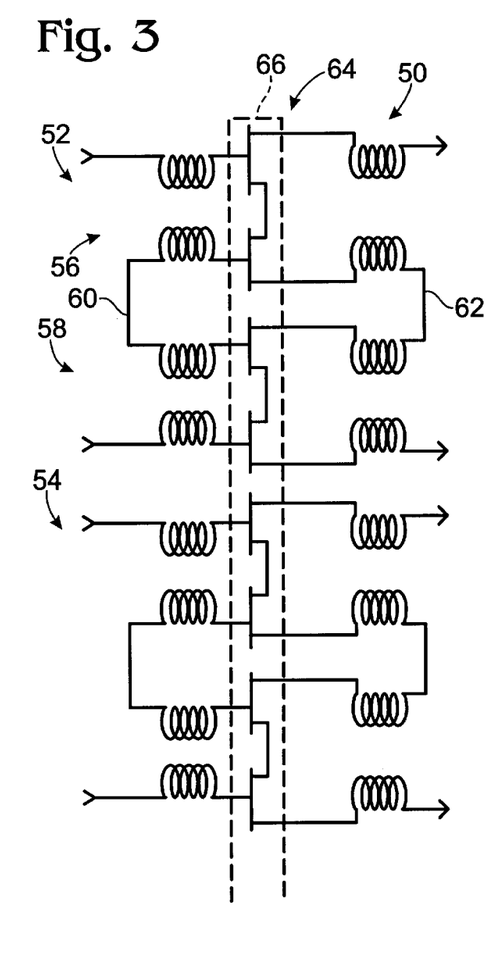
FIG. 3 is a schematic of multiple series-connected circuits of FIG. 2 using a chip having an extended array of FETs.

Through electromagnetic coupling on the input and output, the signal is divided for amplification by two FETs. This structure may be used in a series/parallel push-pull configuration, as shown in FIG. 3 for impedance transformation. This figure illustrates a power amplifier 50 having a plurality of series (push-pull) sections, such as sections 52 and 54. Each section 52 and 54 includes two circuit portions 56 and 58 that are equivalent to circuit 32 of FIG. 2 except that rather than the connections to ground, the two circuit portions are joined together, as shown at connections 60 and 62. This results in a virtual ground at the point of connection.

By dividing an input signal into a signal for each circuit section and recombining the output signals, such as by the use of Wilkinson dividers, substantial power combination is achieved. Impedance matching can be provided at the individual FETs, or before or after signal division or recombination.

Figure 4:
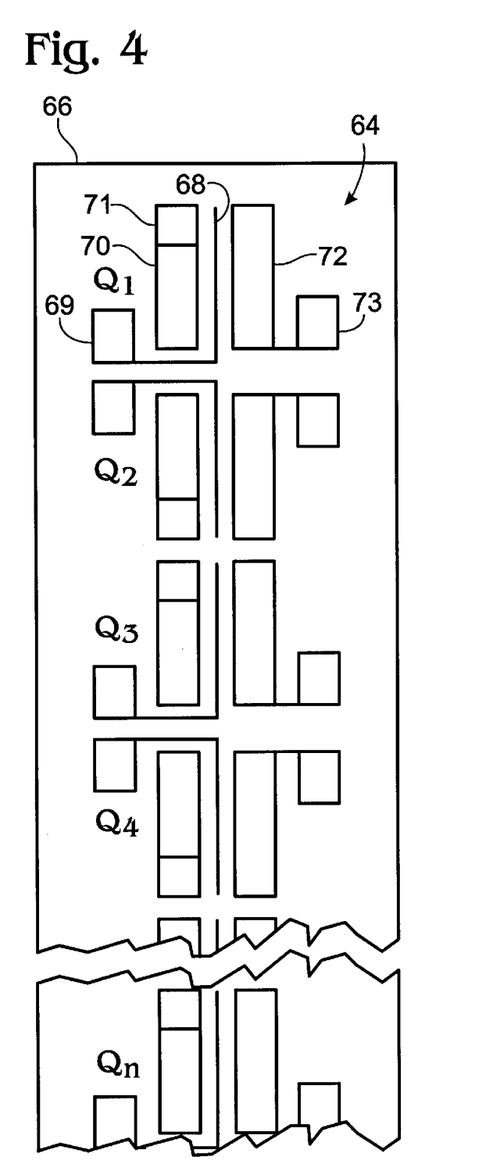
FIG. 4 is a simplified plan view of a chip usable in the circuits of FIG. 3.

The FETs may be aligned in a linear array 64 of FETs, which array may be formed of a single chip 66 fabricated as has been described with reference to FIG. 1. An exemplary FET or bipolar transistor physical diagram for chip 66 is shown in FIG. 4. In this case, the transistors are shown as replications of transistor pairs $Q_1$, and $Q_2$, $Q_3$ and $Q_4$, and the like. Each transistor pair corresponds with the first and second FETs in a circuit portion shown in FIG. 3. As was described with reference to FIG. 1, each FET, such as FET $Q_1$, includes a gate 68, a gate terminal 69, a source 70, a source terminal 71, a drain 72, and a drain terminal 73. The structures of these transistor pairs can be different, depending on the respective functions they perform.

Figure 5:
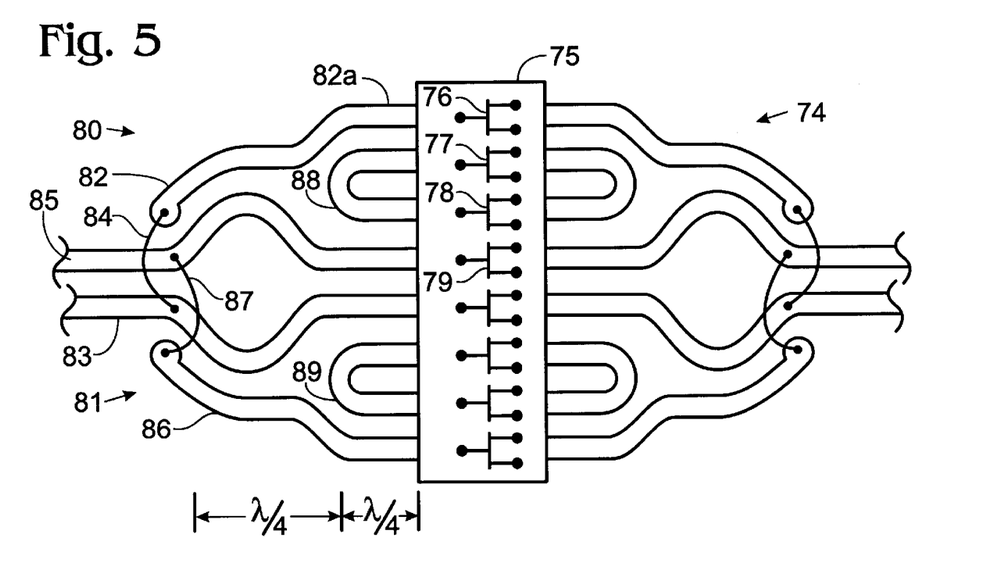
FIG. 5 illustrates a plan view of a first embodiment of the circuit of FIG. 3 using microstrip-line conductors.

An embodiment of power amplifier 50 is shown as amplifier 74 in FIG. 5. Chip 75 has eight FETs, including FETs 76, 77, 78 and 79. Amplifier 74 includes similar series push-pull circuit sections 80 and 81. Quarter-wave input microstrip-line conductors 82 and 83 are connected by an air bridge 84. Similarly, input microstrip-line conductors 85 and 86 are connected by an air bridge 87. These conductors, which include quarter-wave portions such as portion 82a, provide input signals to each section. Electromagnetic coupling provides a complementary input signal to the second FET of the lower portion of each section, such as FETs 77 and 78. The respective second FETs are coupled together by respective U-shaped conductors 88 and 89. The microstrip lines on the output side are similar in general form to the conductors on the input side.

The microstrip lines are designed to achieve whatever impedance is needed. The input or output impedances are connected in series until the impedance is high enough, and then they are connected in a number of parallel sections appropriate for the desired power level.

Figure 6:
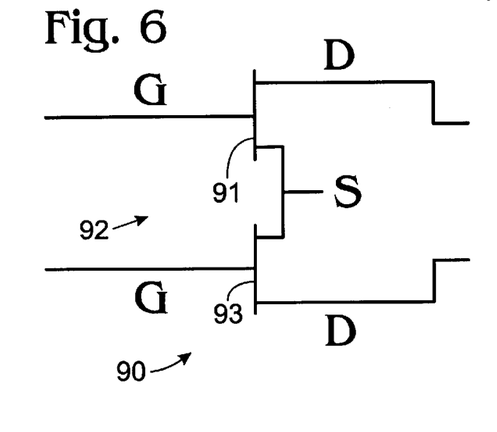
FIG. 6 illustrates a simple schematic of a push-pull amplifier usable in a second embodiment of the invention.
Figure 7:
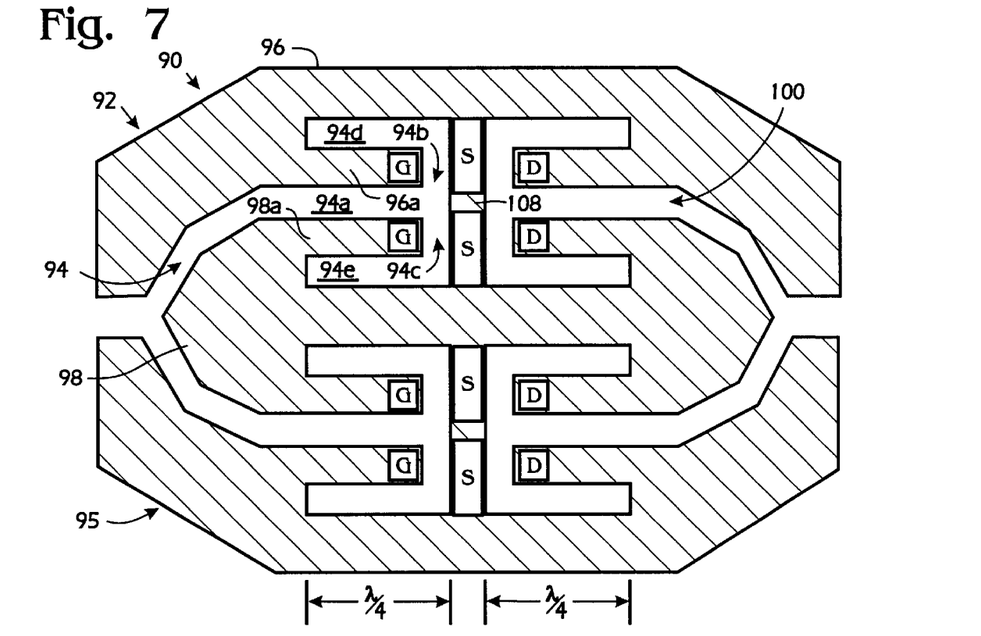
FIG. 7 illustrates a plan view of the second embodiment of the circuit of FIG. 3 using slotlines.
Figure 8:
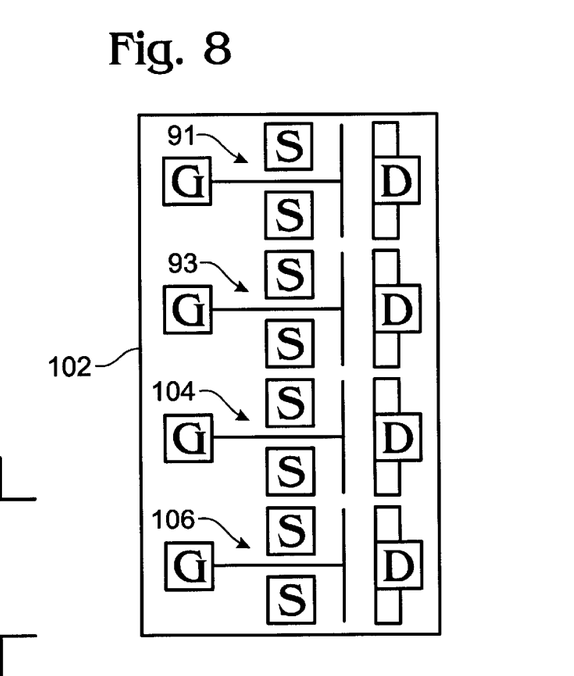
FIG. 8 illustrates a plan view of the layout of FETs in an array usable as a chip for the embodiment of FIG. 7.

FIGS. 6–8 illustrate a power amplifier 90 that embodies the invention using slotlines. FIG. 6 is a schematic of a push-pull section 92 having two FETs 91 and 93 with joined sources. Two balanced input signals are applied to the respective gates, and two balanced output signals are produced on the respective drains.

FIG. 7 illustrates the preferred form of the slotlines for section 92 and an additional section 95 similar to section 92, as they would appear on the substrate of a motherboard, on a hybrid substrate, or on another type of base substrate. Amplifier 90 is operationally equivalent to amplifier 74. An input slotline 94, also referred to as a subcircuit of the circuit of amplifier 90 and formed by opposite planar conductors 96 and 98, is shaped like a reverse "E" with a long center leg portion 94a, oppositely extending transverse bends 94b and 94c, and closed-ended outer leg portions 94d and 94e that are parallel to center leg portion 94a. This shape produces respective open-ended conductor fingers 96a and 98a extending between the slotline leg portions.

The outer leg portions function as RF chokes. The output slotline 100 is a mirror image of the input slotline and functions the same way although the dimensions will be different due to impedance-matching differences of the input and output circuits. Corresponding FET structure is shown by chip 102 in FIG. 8 as it would appear when mounted on slotlines 94 and 100. Chip 102 contains FETs 91, 93, 104 and 106, having respective gate, source and drain terminals identified as G, S, and D. These terminals line up with the corresponding terminals identified in FIG. 7.

Chip 102 is flip mounted onto the metalization shown in FIG. 7, with the gate connected to the ends of the input fingers, the source is connected to a conductor 108 connecting conductors 96 and 98 between the backs of the E-shaped slotlines. Conductor 108 functions as a virtual ground. The drain terminals are accordingly connected to the ends of the output fingers, as shown.

FIGS. 9 and 10 illustrate a power amplifier 110 including a subcircuit 112, shown in FIG. 9, formed as metalization on the base substrate, and a flip-mounted chip 114, shown in FIG. 10, as it appears when mounted on the metalization. As is described in U.S. Pat. No. 5,528,203 issued on Jun. 18, 1996, coplanar waveguides also provide impedance matching and signal transmission for power amplifiers.

Metalization 112 includes an input coplanar waveguide 116 having a signal conductor 118 and opposing planar ground or reference conductors 120 and 122. The signal conductor is initially a single line 118a, and then divides at a junction 124 into dual lines 118b and 118c. A resistor 126 connects lines 118b and 118c. A ground conductor 128 extends between the signal line.

Except for impedance-matching differences, an output coplanar waveguide 130 is substantially a mirror image of the input coplanar waveguide relative to a connecting ground plane strip 132 extending under FET-array chip 114. This metalization results in the array of FETs being connected in parallel rather than in series/parallel for push-pull operation.

Referring to FIG. 10, FET chip 114 has two sets 134 and 135 of double FET-pairs 136. Each FET-pair 136 in the chip has an associated terminal flip-mounted to corresponding terminals on the subcircuit. Thus, a gate terminal 138 is connected to gates 139 and 140. Source terminals 141 and 142, and drain terminal 143, are connected respectively to sources 144 and 145, and drain 146. FET terminals 138, 141, 142 and 143 are connected to respective subcircuit terminals 150, 151, 152 and 153.

Drain 146 functions as a drain for both FETs in FET-pair 136. Similarly, each source, like source 142, serves as a source for associated FETs in adjacent pairs. These double-duty terminals thus are, in effect, connected terminals.

Although chip 114 is specially designed in this embodiment, it could be modified to be cut from a wafer of sets of FET-pairs. In such a case, separate source terminals would be provided for each FET-pair 136 or set of double FET-pairs. Alternatively, amplifier 110 could be made with parallel, dual metalizations 112 and 130 to which is mounted a single chip having the FET configuration of chip 114 duplicated.

Figure 11:
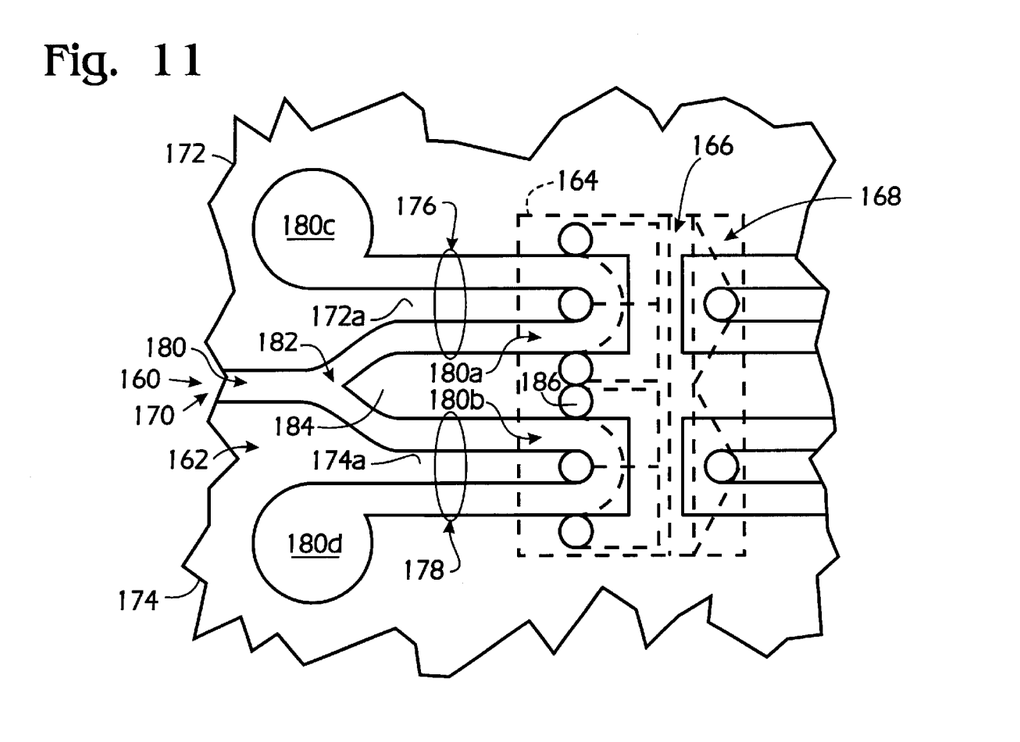
FIG. 11 is a plan view illustrating another embodiment of the circuit of FIG. 3 having a conversion of slotline to dual coplanar waveguide.

FIG. 11 illustrates a portion of a power amplifier 160 having a base subcircuit 162 onto which is flip-mounted a FET chip 164, shown in dashed lines. As was the case with amplifier 90, the FETs, such as FET 166, in the array 168 of FETs in chip 164, are connected electrically in series at the input (gate).

The input portion of subcircuit 162 is different in this embodiment. It provides a conversion from an input slotline 170, formed by coplanar conductors 172 and 174, to dual coplanar waveguides 176 and 178. These output lines could be combined in a manner similar to the input circuit or as push-pull lines. Instead of terminating in the E-shaped slot of amplifier 90 illustrated in FIG. 7, a slot 180 divides at a junction 182 into elongate U-shaped slots 180a and 180b.

The U-shaped slots terminate in circular openings 180c and 180d. These openings function as open circuits, thereby allowing the input signal to be carried by respective conductors formed as open-ended conductor legs 172a and 174a extending into the U-shaped slots. An intermediate conductor 184, connected to conductors 172 and 174 beneath chip 164, extends from junction 182 to source terminals, such as terminal 186, of the FETs. The mounting and connection of the FETs to the conductors is the same as that described with regard to amplifier 90.

Figure 12:
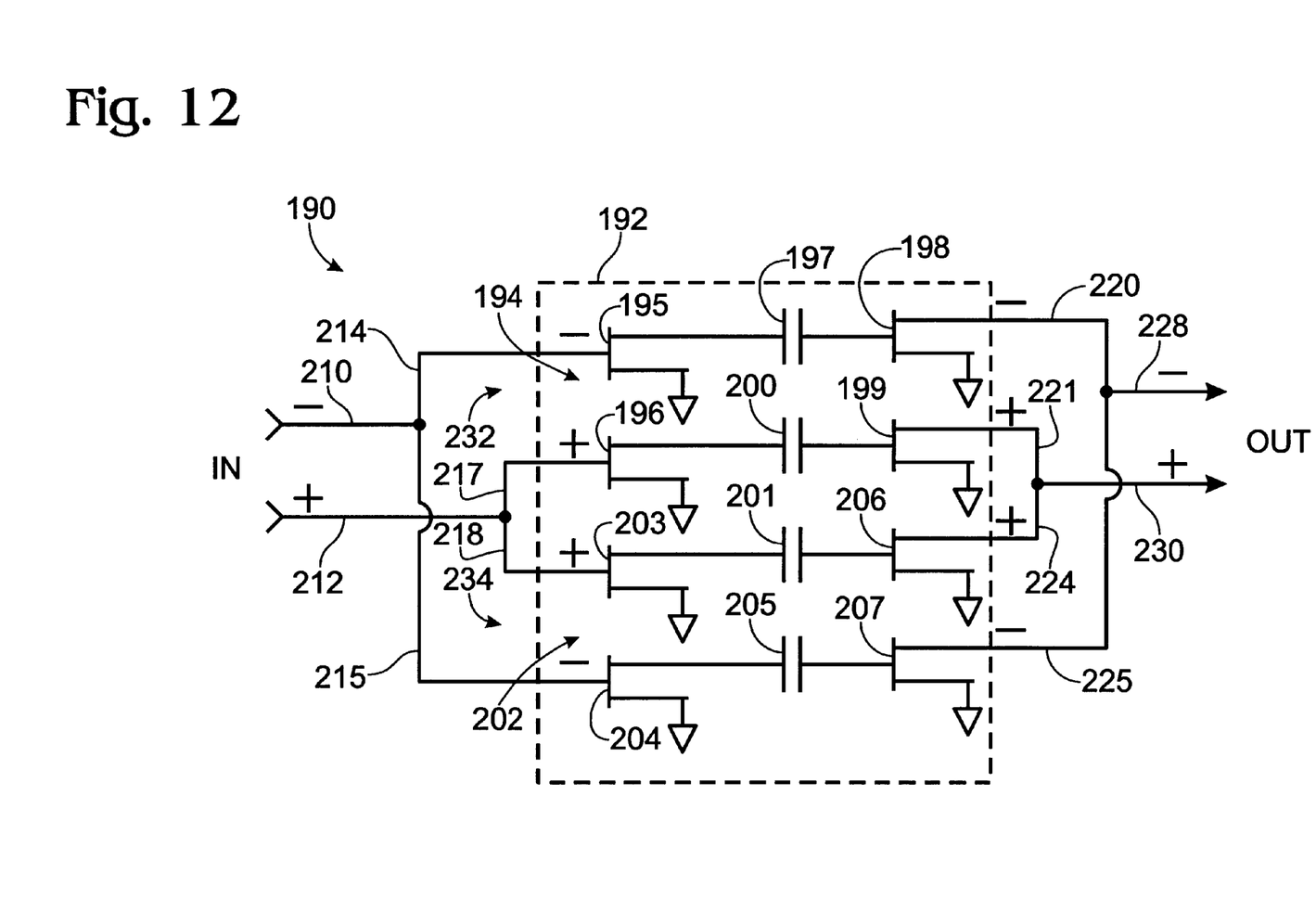
FIG. 12 is a simple schematic of another embodiment of a push-pull amplifier made according to the invention.
Figure 13:
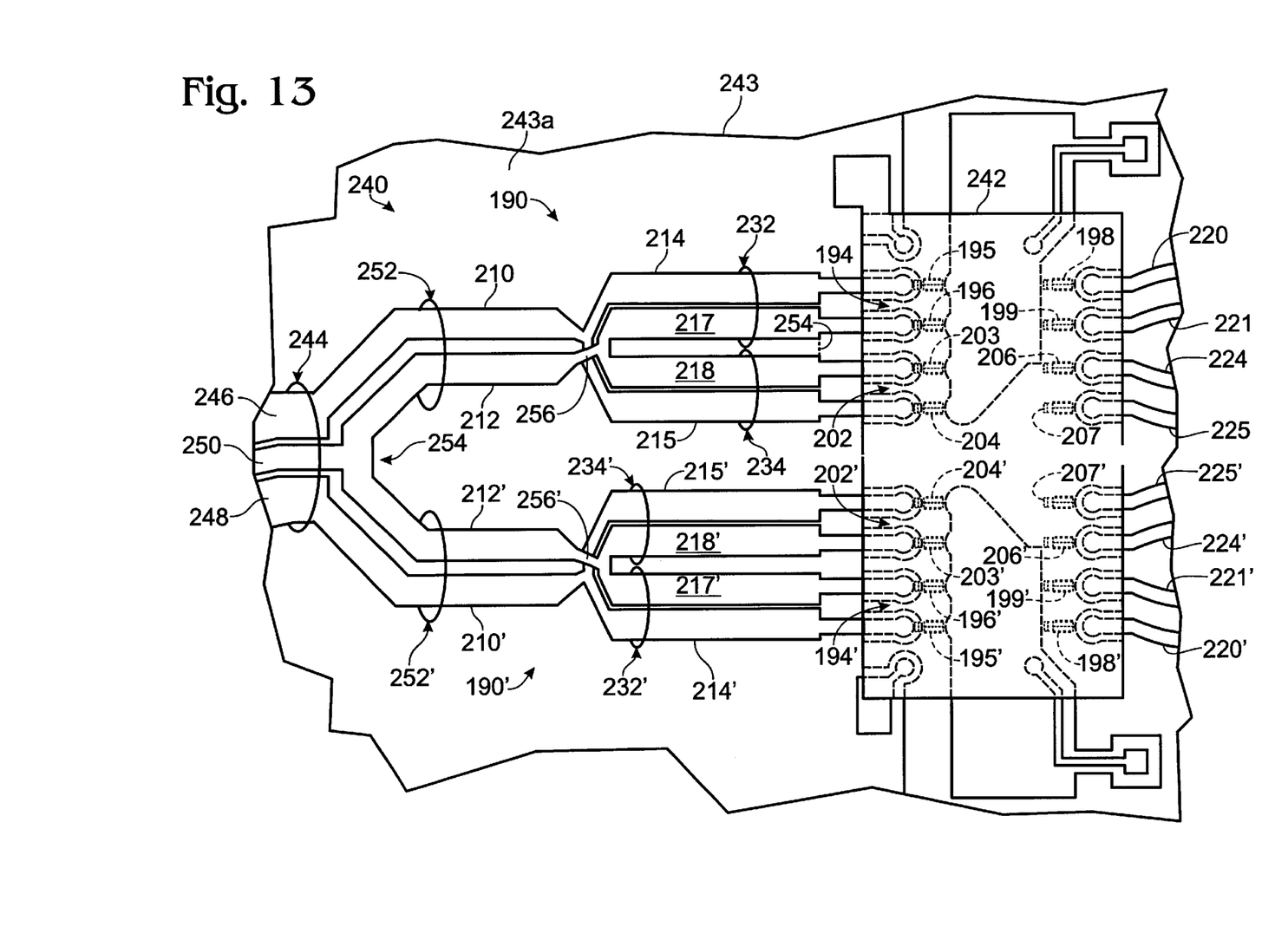
FIG. 13 is a plan view of a preferred embodiment of the amplifier illustrated in FIG. 12.

FIGS. 12 and 13 illustrate a push-pull amplifier 190, which is a modified version of the push-pull amplifier shown in FIGS. 6–8. Amplifier 190 includes a chip 192 (illustrated by the circuit within the dashed outline) having a plurality of pairs of active devices making the amplifier a two-stage amplifier. Other amplifier configurations may also be used. The active devices include a first pair 194 comprising input FETs 195 and 196 in series respectively with output FETs 198 and 199 via respective coupling capacitors 197 and 200. The chip also includes a second pair 202 comprising input FETs 203 and 204 in series respectively with output FETs 206 and 207 via respective coupling capacitors 201 and 205. Each pair of series connected FETs, such as FETs 195 and 198, form what is generally referred to herein as an active device.

An input signal is applied to input conductors 210 and 212, which split respectively into input conductors 214, 215 and 217, 218, as shown. Input conductors 214, 215, 217 and 218 are connected respectively to the gates of FETs 195, 196, 203 and 204. Similarly, the drains of FETs 198, 199, 206 and 207 are connected respectively to output conductors 220, 221, 224 and 225. Conductors 220 and 225 are joined to output conductor 228 and conductors 221 and 224 are joined to output conductor 230.

The conductor configurations illustrated, particularly when embodied as slotlines, can have a particular advantage, as is described below. It is seen that the output conductors are shown to have the same configuration as the input conductors. This is shown to illustrate that the structure can be used for either the input conductors, the output conductors, or both, depending on the particular application. The following discussion is directed to the input conductor configuration, it being understood that the equivalent also applies to the output conductors.

Although illustrated simplistically, it is seen that conductors 214 and 215 surround conductors 217 and 218. As is described with reference to the push-pull amplifiers described earlier, the parallel portions of conductors 214 and 217 and the parallel portions of conductors 215 and 218, adjacent to the chip, form respectively baluns 232 and 234. When input conductors 210 and 212 are, or are connected to, an unbalanced transmission line, the baluns couple the unbalanced transmission line to the corresponding balanced active devices in chip 192 for push-pull operation.

The transmission line structure illustrated in FIG. 12 provides a further advantage when the signal phases are applied as shown. That is, the common or negative phase is applied to conductor 210 which conducts it to conductors 214 and 215. The positive phase is then applied to conductors 217 and 218 via conductor 212. The result is that the inner conductors 217 and 218, both of which have the positive phase signal, do not couple, thereby allowing them to be placed closely together, or even made of a single, integral conductor.

A preferred embodiment of the circuit of FIG. 12 is illustrated as amplifier 240 in FIG. 13. For clarity, the equivalent elements are assigned the same reference numbers. Amplifier 240 includes two amplifiers 190 and 190' shown in FIG. 13 in parallel. The equivalent elements of second amplifier 190' are assigned the same reference numbers as those for amplifier 190 with the addition of a prime ('). Amplifier 190 is a mirror image of amplifier 190' as to the arrangement of elements, with the active devices of both included in a single chip 242. The amplifier is formed on the planar surface 243a of a base substrate 243.

An input coplanar waveguide 244 includes outer ground conductors 246 and 248 which extend along the sides of center signal conductor 250. The coplanar waveguide transitions into two slotlines 252 and 252' at a junction 254. Ground conductor 246 is integral with slotline conductor 210, and ground conductor 248 is integral with slotline conductor 210'. The signal conductor 250 is connected to inner slotline conductors 212 and 212', which in turn are connected, via air bridges 256 and 256', to respective inner conductors 217, 218 and 217', 218'. Baluns 232, 232', 234 and 234' are correspondingly in the form of slotlines, as shown.

The structure of amplifier 240 may also be combined with a mirror image of it, not shown, to form a larger amplifier. Additionally, as has been mentioned, the output conductors may have a configuration corresponding to the input conductors. It will also be understood that the coplanar waveguide or other unbalanced transmission line, such as a microstrip line, could be connected directly to slotline baluns 232 and 234, similar to the connection of coplanar waveguide 244 to slotlines 252 and 252' so long as the impedances are acceptable.

It will be appreciated that the present invention provides a push-pull amplifier having a plurality of pairs of active devices connected to a corresponding plurality of coplanar transmission lines formed on a base substrate. The transmission lines have respective first and second pairs of conductors. The first conductor of each pair conducts a signal in phase opposition relative to a signal conducted on the second conductor of the pair. An active device associated with each conductor has an input or output terminal connected to the associated conductor, whereby each pair of active devices is connected in push-pull configuration.

As has been mentioned, adjacent conductors of adjacent slotlines, such as conductors 217 and 218, preferably conduct in-phase signals. Conductors 217 and 218 thus could also be made of a single metalization 254 represented by the dashed line connecting the two conductors.

Preferably, the active devices are formed on a matrix die or chip that is flip-mounted to the transmission lines. Several advantages are thereby realized. The chip may be made using a single, simple FET process, as well as a MMIC process. Prototyping is easily accommodated since the wafer can be cut up into a variety of different configurations. The production units can then be made the same as the prototype. Suitable wafers can be made even before the application is determined. High yields and high volume production are realizable.

It will therefore be apparent to one skilled in the art that variations in form and detail may be made in the preferred embodiments without varying from the spirit and scope of the invention as defined in the claims, including any meaning as may be provided under applicable legal doctrines of claim interpretation. The preferred embodiments are thus provided for purposes of explanation and illustration, but not limitation.

What is claimed is:

1. A push-pull amplifier for amplifying a radio frequency signal comprising:
    a substrate having a planar substrate surface;
    a first coplanar transmission line positioned on the substrate surface and having first and second conductors with the first conductor conducting the signal in phase opposition relative to the second conductor;
    a second coplanar transmission line also positioned on the substrate surface, connected electrically in parallel with the first transmission line, and having third and fourth conductors, the third conductor conducting the signal in phase opposition relative to the fourth conductor;
    first, second, third and fourth active devices having respective first, second, third and fourth input terminals and respective first, second, third and fourth output terminals, the current flowing through the output terminal of an active device depending upon the signal applied to the input terminal, the first, second, third and fourth input terminals or the first, second, third and fourth output terminals being connected, respectively, to the first, second, third and fourth conductors;
    whereby the first and second active devices are connected in push-pull configuration, and the third and fourth active devices are connected in push-pull configuration.

2. An amplifier according to claim 1 wherein the second and third conductors are adjacent to each other and conduct the signal with the same phase.

3. An amplifier according to claim 2 wherein the first and second transmission lines are slotlines.

4. An amplifier according to claim 3 wherein the first, second, third and fourth active devices are formed in a single integrated circuit chip flip-mounted onto the conductors.

5. An amplifier according to claim 1 wherein the first, second, third and fourth active devices are formed in a single integrated circuit chip flip-mounted onto the conductors.

6. An amplifier according to claim 1 wherein the first and second transmission lines are first and second slotlines, respectively.

7. An amplifier according to claim 6 wherein the second and third conductors are adjacent to each other and conduct the signal with the same phase.

8. An amplifier according to claim 7 further comprising an unbalanced-signal transmission line having a signal conductor and a ground conductor joined to the first and second slotlines distally of the active devices.

9. An amplifier according to claim 8 wherein the second and third conductors are connected to the signal conductor.

10. An amplifier according to claim 8 wherein the first and fourth conductors are connected to the ground conductor.

11. An amplifier according to claim 7 wherein the second and third conductors are integrally joined.

* * * * *